(12) United States Patent
Bandholz et al.

(10) Patent No.: US 7,507,102 B1
(45) Date of Patent: Mar. 24, 2009

(54) METHOD FOR HORIZONTAL INSTALLATION OF LGA SOCKETED CHIPS

(75) Inventors: Justin Potok Bandholz, Cary, NC (US); Jonathan Randall Hinkle, Raleigh, NC (US); Clifton Ehrich Kerr, Durham, NC (US); John Frank Nations, Jr., Raleigh, NC (US); William James Sommerville, Raleigh, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/865,819

(22) Filed: Oct. 2, 2007

(51) Int. Cl.
*H01R 4/50* (2006.01)
(52) U.S. Cl. ....................................... 439/342
(58) Field of Classification Search ................. 439/342, 439/331, 259, 266, 68, 73, 330, 135
See application file for complete search history.

(56) References Cited

U.S. PATENT DOCUMENTS

| | | | |
|---|---|---|---|
| 5,186,642 A | 2/1993 | Matsuoka et al. | |
| 5,669,780 A | 9/1997 | Fukunaga | |
| 6,106,319 A | 8/2000 | Fukunaga et al. | |
| 6,267,615 B1 | 7/2001 | Lin | |
| 6,428,337 B2 | 8/2002 | Ohshima et al. | |
| 6,482,022 B2 | 11/2002 | Trout et al. | |
| 6,692,280 B2 | 2/2004 | Renfro et al. | |
| 6,758,684 B2 * | 7/2004 | Oikawa et al. | 439/73 |
| 6,790,065 B2 | 9/2004 | Fukunaga | |
| 6,811,421 B1 * | 11/2004 | Gattuso et al. | 439/266 |
| 6,824,411 B2 | 11/2004 | Ohshima | |
| 6,857,888 B2 | 2/2005 | Hayakawa | |
| 6,945,798 B2 * | 9/2005 | McClellan et al. | 439/135 |
| 6,971,902 B2 | 12/2005 | Taylor et al. | |
| 7,179,093 B2 | 2/2007 | Holmberg et al. | |
| 2006/0105608 A1 * | 5/2006 | Ma | 439/331 |
| 2006/0121751 A1 | 6/2006 | Liao | |

* cited by examiner

*Primary Examiner*—Alexander Gilman
(74) *Attorney, Agent, or Firm*—Cynthia Byrd; Jeffrey L. Streets

(57) ABSTRACT

Method and apparatus for installing a processor into electronic communication with a socket. The land grid array socket connector includes a socket housing secured to a circuit board and an array of upwardly extending pins for electronic communication with contact pads on the processor. The socket connector provides a carriage configured to receiving the processor through a lateral opening and support a perimeter edge of the processor. A mechanical linkage couples the carriage and the socket housing for substantially vertically translating the processor relative to the socket. A plurality of alignment features upwardly extends from the socket housing along the perimeter of the array of pins. Each of the alignment features has an inwardly-facing tapered surface for registering the edge of the processor and biasing the processor into a position where the array of contact pads are aligned with the array of pins as the processor is lowered.

16 Claims, 4 Drawing Sheets

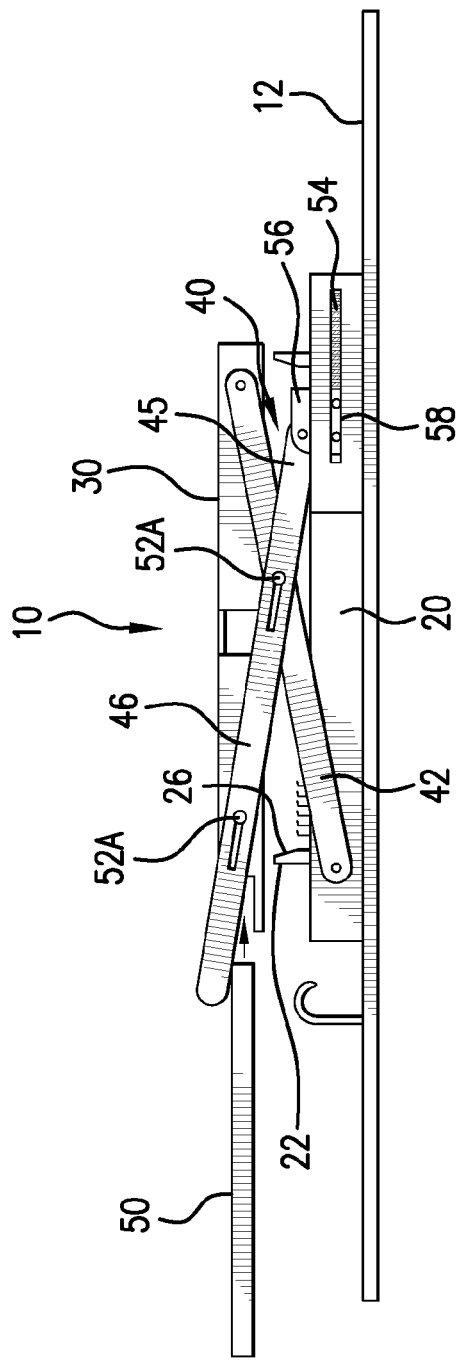
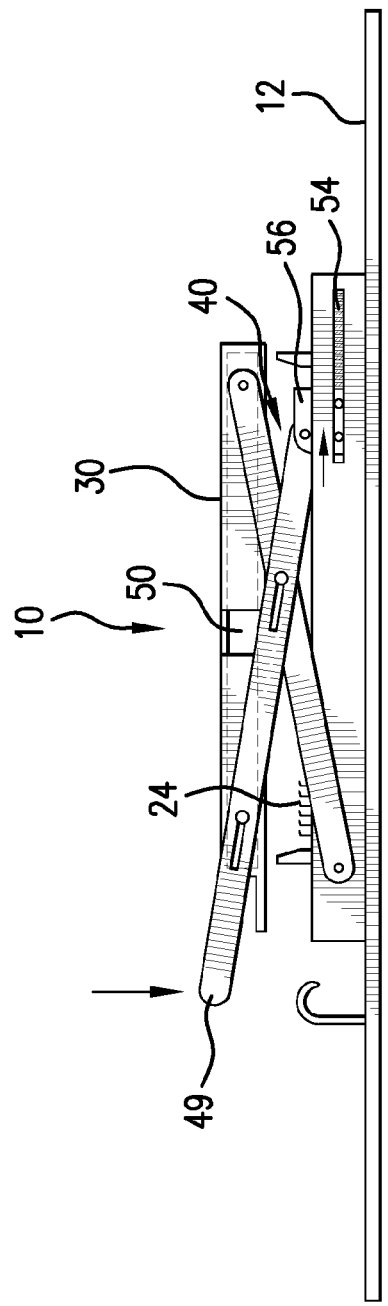

METHOD FOR HORIZONTAL INSTALLATION OF LGA SOCKETED CHIPS

BACKGROUND OF THE INVENTION

1. Field of the Invention

The present invention relates to area array socket connectors, such as a land grid array (LGA) socket connector.

2. Description of the Related Art

A central processing unit (CPU) socket is the connector linking the motherboard to the CPU in certain types of desktop and server computers. CPU sockets and processors may be built around the pin grid array (PGA) architecture, in which the pins on the underside of the processor are inserted into the socket. To aid installation, zero insertion force (ZIF) sockets are usually used, allowing the processor pins to be inserted into the socket without any resistance, while gripping the pins firmly once the processor is in place to ensure a reliable contact. An alternative to the PGA architecture is the land grid array (LGA) architecture in which the pins reside on the socket rather than the CPU. The pins come into contact with pads on the bottom of the processor.

While there is great utility in using PGA and LGA architecture, there are still problems that occur. One of the primary problems with these architectures, for example the LGA architecture, is that the pins can become bent during the installation of the processor chip into the socket. The very act of lowering the chip can cause one or more of the pins to bend, resulting in failure of the electronic connector at that the affected pins. It is even possible in many installations for the chip to be dropped directly onto the pins.

In addition to a controlled lowering of the chip, a successful installation of a chip should provide for accurate alignment of the pins and contact pads. For example, in the LGA architecture, it is important to accurately align the array of contact pads on the underneath side of the processor chip with the array of upwardly facing pins on the socket. Inaccurate alignment of the pins and contact pads can also result in pin damage or failure of the electronic communication therebetween. A damaged LGA socket renders the entire motherboard unusable and irreparable without incurring considerable expense.

Therefore, there is a need for an apparatus that easily and accurately aligns and installs a processor chip into a socket without damaging the pins. It would be desirable if the apparatus applied a hold-down force to the processor to maintain contact between the contact pads and the pins. Furthermore, it would be even more desirable if the apparatus accommodated the use of a heat sink to make thermal contact with the flat upper surface of the processor.

SUMMARY OF THE INVENTION

One embodiment of the present invention provides a land grid array socket connector. The socket connector comprises a socket housing secured to a circuit board and an array of pins upwardly extending from the socket housing for electronic communication with an array of contact pads on a processor. The socket connector provides a carriage including a channel configured to receiving the processor through a lateral opening and support the processor along a perimeter edge of the processor. A mechanical linkage couples the carriage and the socket housing for substantially vertically translating the processor relative to the socket. In addition, a plurality of alignment features upwardly extends from the socket housing along the perimeter of the array of pins. Each of the alignment features has an inwardly-facing tapered surface for registering the edge of the processor and biasing the processor into a position where the array of contact pads are aligned with the array of pins as the processor is lowered.

Another embodiment of the present invention provides a method for installing a processor into electronic communication with a socket, The method comprises horizontally receiving a processor into a carriage substantially vertically above the socket, translating the carriage substantially vertically downward toward the socket, causing the processor to self-align with the socket as the processor moves downward, moving an array of contact pads on the self-aligned processor further downward into contact with an array of pins on the socket, and securing the self-aligned processor in position with the array of contact pads in contact with the array of pins. Optionally, the step of causing the processor to self-align with the socket may include engaging an edge of the processor against an inwardly-facing tapered surface of an alignment feature, or registering the processor with a plurality of alignment features. A hold-down force is preferably applied to the processor while the self-aligned processor is secured in position with the array of contact pads in contact with the array of pins.

BRIEF DESCRIPTION OF THE DRAWINGS

FIG. 2 is a side view of the electronic connector in an open position for horizontally receiving a processor chip into a carriage.

FIG. 3 is a side view of the electronic connector having received the processor chip in the carriage.

DETAILED DESCRIPTION OF PREFERRED EMBODIMENTS

Figure 1:
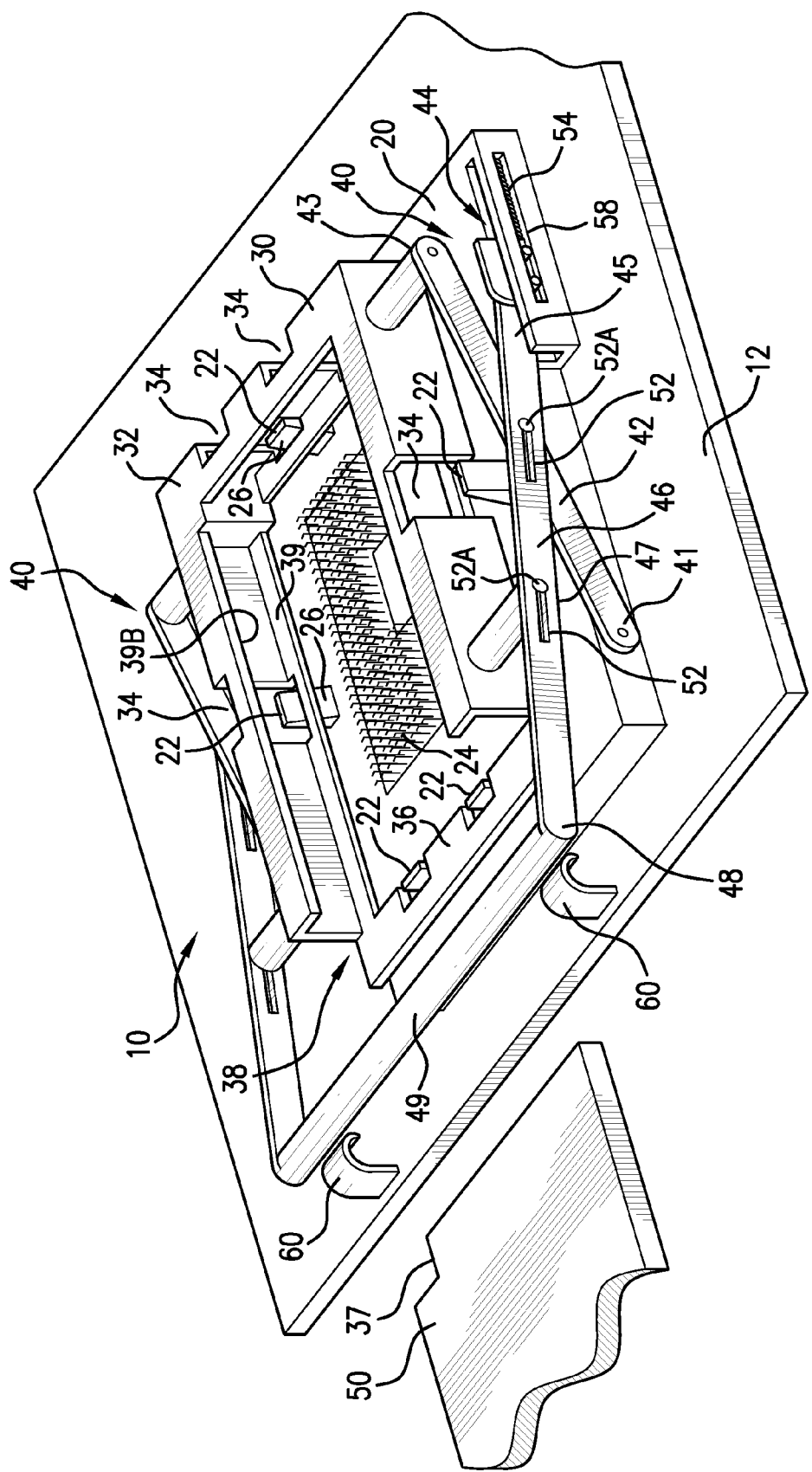
FIG. 1 is a perspective view of an electronic connector in accordance with one embodiment of the invention.

One embodiment of the present invention provides a land grid array socket connector. The socket connector comprises a socket housing secured to a circuit board and an array of pins upwardly extending from the socket housing for electronic communication with an array of contact pads on a processor. The socket connector provides a carriage including a channel configured to receiving the processor through a lateral opening and support the processor along a perimeter edge of the processor. The carriage is preferably open over a substantial portion of the opposing faces so that opposing faces of the processor are still exposed after being received into the carriage. Accordingly, the carriage does not interfere with electronic communication between the socket and the lower face of the processor and does not interfere with thermal communication between a heat sink and the upper face of the processor. The array of pins extend upwardly from the socket housing, through the opening in the lower face of the carriage, and into contact with the contact pads on the processor. If the upper edge of the channel creates an stand-off that interferes with direct contact between the heat sink and the upper face of the processor, then a heat sink with a raised contact region may be used so that the contact region extends through the opening in the upper face of the carriage and into contact with the exposed face of processor.

A mechanical linkage couples the carriage and the socket housing for substantially vertically translating the processor relative to the socket. By providing the processor in a substantially horizontal plane (a plane that is substantially parallel to the plane of the socket) and translating the processor in a substantially vertical direction (a direction perpendicular to the plane of the socket), the likelihood of damaging a pin is minimized. Although various mechanical linkages can be envisioned, a preferred mechanical link includes a pair of scissor arms pivotally coupled between the carriage and the socket along two opposing sides of the carriage. Optionally, each pair of scissor arms may include a sliding linkage that is biased against lowering the carriage toward the socket. The sliding linkage allows the pivot points of the scissor arms to move apart and also provides a convenient point to bias the arms together so that the carriage is self-supported above the socket for receiving a processor. Still further, an actuator handle may be secured to at least one of the scissor arms for conveniently vertically lowering the carriage.

The socket connector may include a latch for securing the actuator handle, or other portion of the mechanical linkage, when the carriage is in a lowered position. Accordingly, the carriage is secured with the processor contact pads in electronic communication with socket pins. Preferably, the latch itself may impart a downward bias the processor with a hold-down force against the socket pins.

In addition, a plurality of alignment features or pins upwardly extends from the socket housing along the perimeter of the array of pins. Each of the alignment features engages the processor in a manner that self-aligns the processor relative to the socket, so that the array of contact pads on the processor are aligned with the array of pins on the socket. Although various self-aligning features could be built into the processor package, it is preferably not to require modification of the processor package. Rather, a preferred alignment feature has an inwardly-facing tapered surface for registering the edge of the processor and laterally biasing the processor into a position where the array of contact pads are aligned with the array of pins as the processor is lowered. Most preferably, the plurality of alignment features includes at least one alignment feature on each of four lateral edges of the processor. As the processor is moved downwardly toward the socket, any misalignment of the processor causes an edge of the processor to engage the tapered surface of an alignment feature and the tapered surface biases that edge of the processor into position. By including a plurality of alignment features about the perimeter of the processor, the processor is brought into proper alignment.

In a preferred embodiment, the carriage channel includes a plurality of vertical openings along the perimeter of the channel. Each vertical opening in the channel is substantially vertically aligned with an alignment feature on the socket, such that the alignment feature extends into the vertical opening as the carriage moves downward. Accordingly, the processor is aligned while still secured within the carriage.

In a further optional embodiment, the carriage channel includes a key member for preventing the channel from fully receiving the processor unless the processor is received in the proper orientation. For example, a substantially rectangular carriage may have an obstruction in a particular corner that prevents full insertion of a processor, unless the processor is inserted into the carriage in an orientation that presents a mating depression or cut-out. A key may be designed in various configurations, but is preferably a standard key that mates with standard processor geometry.

In yet another embodiment, the socket connector includes a latch for securing the mechanical linkage when the carriage is in a lowered position. In this manner, the processor is positively secured prior to heat sink attachment over the exposed face of the processor. Latching the processor in place is believed to further minimize the likelihood of damaging a socket pin. Although, the latch may apply a hold-down force to the processor, it is still possible for the heat sink attachment to apply a further hold-down force.

Another embodiment of the present invention provides a method for installing a processor into electronic communication with a socket, The method comprises horizontally receiving a processor into a carriage substantially vertically above the socket, translating the carriage substantially vertically downward toward the socket, causing the processor to self-align with the socket as the processor moves downward, moving an array of contact pads on the self-aligned processor further downward into contact with an array of pins on the socket, and securing the self-aligned processor in position with the array of contact pads in contact with the array of pins. Optionally, the step of causing the processor to self-align with the socket may include engaging an edge of the processor against an inwardly-facing tapered surface of an alignment feature, or registering the processor with a plurality of alignment features. A hold-down force is preferably applied to the processor while the self-aligned processor is secured in position with the array of contact pads in contact with the array of pins. The method may further optionally include biasing the carriage to resist downward movement of the carriage.

FIG. 1 is a perspective view of an electronic connector in accordance with one embodiment of the invention. The electronic connector 10 is mounted on a circuit board 12 which provides for electronic communication between multiple components of a computer system (not shown). The electronic connector 10 includes a socket 20, a carriage 30, and a mechanical linkage 40 on opposing sides of the connector coupling the carriage vertically above the socket.

The carriage 30 forms a channel 32 that is configured to receive the edges of a processor 50 when inserted in the proper orientation. The carriage 30 has a lateral opening 38 (shown here on the front, left side of the carriage) for receiving the processor 50 in an orientation that is within a plane that is substantially parallel to a plane defined by the socket. While is it not necessary for the processor and socket to be in perfectly parallel planes, it is desirable to eliminate any significant angles between the processor and socket, especially as the processor makes contact with the socket. Accordingly, the carriage is preferably substantially parallel to the socket.

The channel 32 extends a sufficient distance around the perimeter edge of the processor 50 to initially support the weight of the processor 50 and later to provide a hold-down force against the processor. It is desirable for the channel 32 to have dimensions slightly greater than the dimensions of the processor 50, so that the processor is not stressed during insertion into the carriage and so that there is room within the carriage channel 32 for the processor to orient itself in conjunction with alignment features 22 on the socket 20. Preferably, the channel 32 includes a plurality of openings 34 that aligned for receiving an alignment feature 22 such that the alignment feature 22 can engage the processor 50 within the carriage 30. The carriage 30 also preferably includes a flat bar 36 across the front of the carriage 30, near the lateral opening 38, that allows the processor 50 to rest on the bar 36 as the processor is being inserted into the carriage. The channel 32 includes a lower lip 39A along opposing sides of the carriage that allows the side edges of the processor to slide toward the back of the carriage. The channel 32 also includes a key 35 in the back, left corner that will mate with the cut-out 37 when the processor 50 is inserted in the proper orientation, but will prevent complete insertion of the processor in any other orientation.

The socket housing 20 secures an array of pins 24 arranged in a standard configuration near the center. The plurality of alignment features 22 is disposed around the array of pins in positions that will guide the processor 50 so that the array of contact pads on the bottom of the processor 50 come into precise alignment with the array of pins 24 on the socket 20. Accordingly, the spacing between the alignment features 22 is defined by the dimensions (width and breadth) of the processor package 50. Preferably, at least a portion of an inwardly facing surface 26 of each alignment feature 22 is tapered so that a misaligned edge of the processor 50 will engage the tapered surface 26 as the processor 50 is lowered downwardly toward the array of socket pins 24. The tapered surface 26 engages the misaligned edge of the processor and biases that edge inwardly so that the edge comes into proper alignment before the processor contact pads engage the array of pins 24. In the embodiment shown here, there are a total of six alignment features 22. There are two alignment features positioned to engage each end of the processor and one alignment feature positioned to engage each side of the processor. The positioning of alignment features on all four sides of a processor will dictate the orientation and positioning of the processor within the plane of the carriage.

The mechanical linkage 40 secured the carriage 30 substantially vertically above the socket 20 and provides for substantially vertical translation of the carriage 30 and processor 50 between an elevated position where the processor is disengaged from the socket pins 24 and a lowered position where the processor is engaged with the socket pins 24. The mechanical linkage 40 of FIG. 1 includes a pair of pivotally secured scissor arms secured between the carriage 30 and socket housing 20 on two opposing sides of the electronic connector. In the embodiment shown, a first arm 42 has a first end 41 pivotally secured to the socket housing 20 and a second end 43 pivotally secured to the carriage 30. A second arm 46 has a first end 45 pivotally secured to a slider mechanism 44 on the socket housing 20 and a portion 47 pivotally secured to the carriage 30, and a second end 48 forming a handle 49. The first arm 42 and the second arm 46 are pivotally coupled together at a midpoint between their ends. The second arm 46 includes optional slots 52 that enables a special latching feature when the second arm 46 is in a substantially horizontal position (substantially parallel to the linear movement of the slider mechanism 44).

FIG. 2 is a side view of the electronic connector 10 with the carriage 30 in an elevated position above the socket 20 for horizontally receiving the processor chip 50. The carriage 30 is held in the elevated position by the mechanical linkage 40, which includes the scissor arms 42, 46. The second arm 46 of the mechanical linkage 40 is forwardly biased (to the left in FIG. 2) by a spring 54 that pushes against a slider member 56 that is pivotally coupled to the second arm 46. As the end 45 of the second arm 46 is biased forwardly, the second arm 46 will move forwardly until either the slider member 56 reaches the full extent of its track 58 or further movement of the second arm 46 meets sufficient resistance to oppose the spring force. With the second arm 46 pivotally coupled at three points along its length, the second arm can bind up and resist further forward movement. Even with the second arm 46 including optional slots 52, the optional slots 52 are preferably configured, with respect to both placement and length, so that the pivot pins 52A that extend through the slots 52 will stop forward movement of the second arm 46 beyond the position that supports the carriage 30 in a horizontal position.

FIG. 3 is a side view of the electronic connector 10 having received the processor chip 50 in the carriage 30. The full positioning of the processor 50 within the carriage 30 is shown in dashed lines. The connector 10 is now ready to lower the processor 50 toward the array of pins 24 on the socket 20. Applying a generally downward force on the handle 49 will actuate the mechanical linkage 40 and cause the slider member 56 to compress the spring 54.

Figure 4:
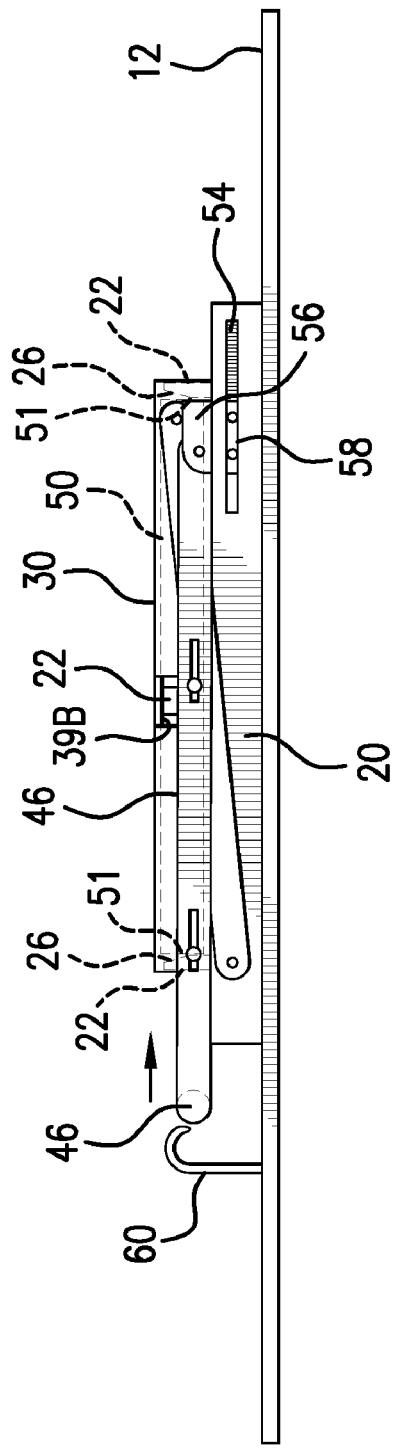
FIG. 4 is a side view of the electronic connector with the carriage lowered to engage the processor chip with the socket and apply a hold-down force.

FIG. 4 is a side view of the electronic connector 10 with the carriage 30 lowered to engage the processor chip 50 with the socket pins 24 (not shown) and apply a hold-down force. To get to this position, the processor 50 was lowered along the alignment features 22, where any misalignment of the processor 50 relative to the socket pins 24 causes the tapered surface 26 to bias the processor edge, such as edges 51, into alignment. The base of the alignment features 22 collectively form a pocket that is suitably sized to receive the processor without any significant mechanical resistance, but also without allowing any misalignment or improper orientation. A hold-down force can be applied to the processor 50 by configuring the mechanical linkage 40 so that the upper lip 39B of the channel 32 begins to bear down on the top face of the processor before the second leg 46 reaches its latched orientation, such as horizontal. Therefore, further downward movement of the second leg 46 into its latched orientation, such as into a substantially horizontal position, biases the contact pads of the processor 50 against the array of pins 24 on the socket 20. Each pin in the array of pins 24 allows for a small degree of deflection and pushes back against the processor.

With the processor successfully engaged with the socket, the second arm 46 is preferably positioned substantially horizontally and parallel to the track 58 that defines the movement of the slider member 56. Although optional, this configuration allows the second arm 46 to be moved horizontally (either right or left in FIG. 4) without raising or lowering the carriage 30. Accordingly, the second arm 46 may be pushed (to the right in FIG. 4) to compress the spring 54 and move the handle 49 to a position adjacent the latch 60. During this movement of the handle 49, it is preferably to maintain a slight downward force on the handle to prevent the spring from elevating the carriage 30.

Figure 5:
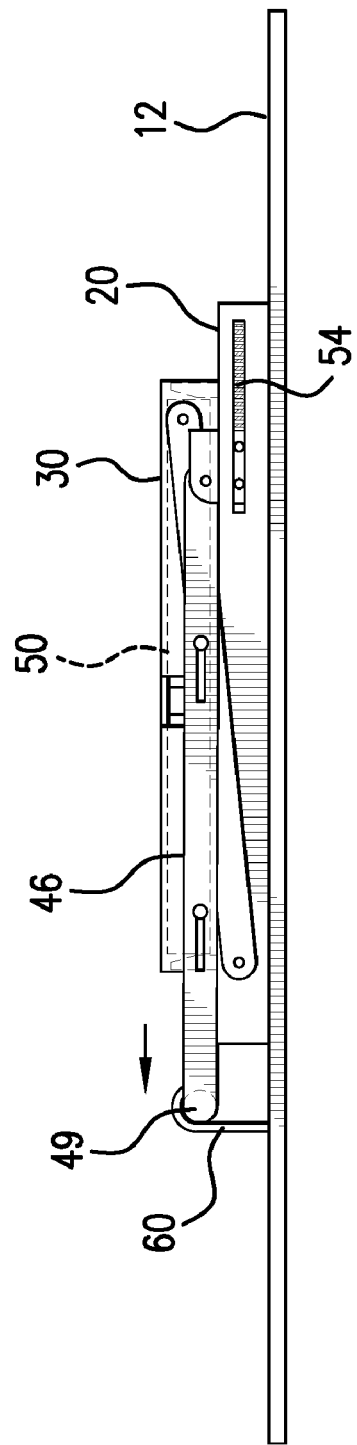
FIG. 5 is a side view of the electronic connector with the actuator handle secured to a latch to retain the processor chip in electronic communication with the socket.

FIG. 5 is a side view of the electronic connector with the actuator handle 49 secured to the latch 60 to retain the processor chip 50 in electronic communication with the socket 20. In this position, the spring 54 serves to bias the handle 49 into the latch 60, thereby providing further assurance that the connector 10 does not elevate accidentally. Many other latch mechanisms can be envisioned by those having ordinary skill in the art having the benefit of this disclosure without departing from the scope of the present invention.

Figure 6:
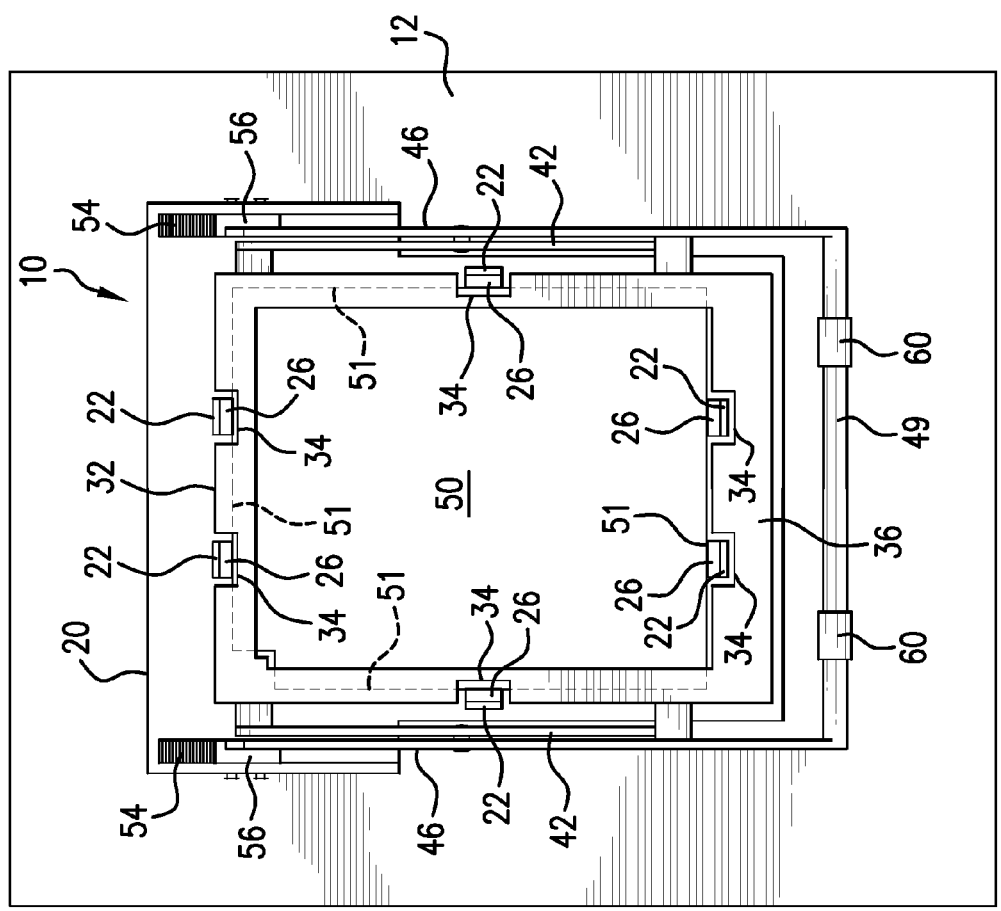
FIG. 6 is a top view of the electronic connector showing that the processor chip has been aligned with the socket through registration with the internally tapered alignment features.

FIG. 6 is a top view of the electronic connector 10 showing that the processor chip 50 has been aligned with the socket 20 through registration or contact with the internally tapered alignment features 22. As shown, the alignment features 22 are themselves aligned with certain openings 34 in the channel 32 and in the flat bar 36. Accordingly, the alignment features 22 engage the edges 51 of the processor 50 to assure that the processor is properly aligned with the array of pins 24 (not shown) on the socket 20. The handle 49 has been secured to the latches 60 to retain the processor in this position. It should be recognized that the processor 50 may be removed from the electronic connector 10 by reversing the steps described in FIGS. 2 through 5.

The terms "comprising," "including," and "having," as used in the claims and specification herein, shall be considered as indicating an open group that may include other elements not specified. The terms "a," "an," and the singular forms of words shall be taken to include the plural form of the same words, such that the terms mean that one or more of something is provided. The term "one" or "single" may be used to indicate that one and only one of something is intended. Similarly, other specific integer values, such as "two," may be used when a specific number of things is intended. The terms "preferably," "preferred," "prefer," "optionally," "may," and similar terms are used to indicate that an item, condition or step being referred to is an optional (not required) feature of the invention.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A land grid array socket connector, comprising:
    a socket housing secured to a circuit board;
    an array of pins upwardly extending from the socket housing for electronic communication with an array of contact pads on a processor;
    a carriage including a channel configured for receiving the processor through a lateral opening for receiving the processor in an orientation that is within a plane substantially parallel to a plane defined by the socket and supporting the processor along a perimeter edge of the processor;
    a mechanical linkage coupled between the carriage and the socket housing for substantially vertically translating the processor relative to the socket; and
    a plurality of alignment features upwardly extending from the socket housing along the perimeter of the array of pins, each of the alignment features having an inwardly-facing tapered surface for registering the edge of the processor and biasing the processor into a position where the array of contact pads are aligned with the array of pins as the processor is lowered.

2. The socket connector of claim 1, wherein carriage channel includes a plurality of vertical openings along the perimeter of the channel, each vertical opening aligned for receiving an alignment feature.

3. The socket connector of claim 1, wherein the mechanical linkage biases the carriage to a position vertically spaced above the socket.

4. The socket connector of claim 1, wherein the carriage channel includes a key member for preventing the channel from fully receiving the processor unless the processor is received in the proper orientation.

5. The land grid array socket connector of claim 1, further comprising:
    the mechanical linkage including a first arm having a first end pivotally secured to the socket housing and a second end pivotally secured to the carriage; and
    the mechanical linkage including a second arm having a first end pivotally secured to a slider mechanism on the socket housing, a second end forming a handle, and a portion between the first and second ends pivotally secured to the carriage; and
    a latch secured to the socket housing, the slider mechanism permitting horizontal movement of the second arm when the carriage is in a lowered position, to selectively engage the handle with the latch.

6. The socket connector of claim 1, wherein the mechanical linkage includes a pair of scissor arms pivotally coupled between the carriage and the socket along two opposing sides of the carriage.

7. The socket connector of claim 6, wherein each pair of scissor arms includes a sliding linkage that is biased against lowering the carriage toward the socket.

8. The socket connector of claim 7, further comprising:
    an actuator handle secured to at least one of the scissor arms for vertically lowering the carriage.

9. The socket connector of claim 8, further comprising:
    a latch secured to the socket for securing the actuator handle when the carriage is in a lowered position.

10. The socket connector of claim 1, further comprising:
    a latch for securing the mechanical linkage when the carriage is in a lowered position, wherein the latched mechanical linkage applies a hold-down force to the processor.

11. The socket connector of claim 1, wherein the plurality of alignment features includes at least one alignment feature on each of four lateral edges of the processor.

12. A method for installing a processor into electronic communication with a socket, comprising:
    horizontally receiving a processor into a channel of a carriage through a lateral opening and in an orientation that is within a plane substantially parallel to a plane defined by the socket and supporting the processor along a perimeter edge of the processor;
    translating the carriage substantially vertically downward toward the socket;
    causing the processor to self-align with the socket as the processor moves downward;
    moving an array of contact pads on the self-aligned processor further downward into contact with an array of pins on the socket; and
    securing the self-aligned processor in position with the array of contact pads in contact with the array of pins.

13. The method of claim 12, wherein the step of causing the processor to self-align with the socket includes engaging an edge of the processor against an inwardly-facing tapered surface of an alignment feature.

14. The method of claim 12, wherein the step of causing the processor to self-align with the socket includes registering the processor with a plurality of alignment features.

15. The method of claim 12, further comprising:
    biasing the carriage to resist downward movement of the carriage.

16. The method of claim 12, further comprising:
    applying a hold-down force to the processor while the self-aligned processor is secured in position with the array of contact pads in contact with the array of pins.

* * * * *